(12) United States Patent
Schauwecker et al.

(10) Patent No.: US 11,506,736 B2
(45) Date of Patent: Nov. 22, 2022

(54) REINFORCEMENT OF A SUPERCONDUCTING MAGNET COIL

(71) Applicant: Bruker Switzerland AG, Faellanden (CH)

(72) Inventors: Robert Schauwecker, Zurich (CH); Matteo Alessandrini, Opfikon (CH); Pierre-Alain Bovier, Zurich (CH); Stephan Heiss, Wiesendangen (CH); Patrik Vonlanthen, Schwerzenbach (CH)

(73) Assignee: BRUKER SWITZERLAND AG, Faellanden (CH)

( * ) Notice: Subject to any disclaimer, the term of this patent is extended or adjusted under 35 U.S.C. 154(b) by 0 days.

(21) Appl. No.: 17/406,552

(22) Filed: Aug. 19, 2021

(65) Prior Publication Data

US 2022/0065960 A1 Mar. 3, 2022

(30) Foreign Application Priority Data

Aug. 31, 2020 (EP) .................................... 20193742

(51) Int. Cl.
*G01R 33/38* (2006.01)
*G01R 33/3815* (2006.01)
*H01F 6/06* (2006.01)

(52) U.S. Cl.
CPC ..... *G01R 33/3802* (2013.01); *G01R 33/3815* (2013.01); *H01F 6/06* (2013.01)

(58) Field of Classification Search
CPC ... G01R 33/3802; G01R 33/3815; H01F 6/06; H01F 41/048; H01F 6/00
See application file for complete search history.

(56) References Cited

U.S. PATENT DOCUMENTS 4,270,112 A * 5/1981 Schneider-Muntau ..................... H01F 27/306 505/879
4,883,922 A 11/1989 Yokota et al.
(Continued)

FOREIGN PATENT DOCUMENTS

EP 0291075 A2 11/1988
EP 0822560 A2 2/1998
(Continued)

OTHER PUBLICATIONS

Van Bockstal et al., "Long Life Pulsed High Field Magnets with CuAg Conductor and Internal Reinforcement", IEEE Transactions on Magnetics, vol. 32, No. 4, Jul. 1996, 4 pages.
(Continued)

*Primary Examiner* — G. M. A Hyder
(74) *Attorney, Agent, or Firm* — Edell, Shapiro & Finnan, LLC

(57) ABSTRACT

A superconducting magnet assembly with a reinforced coil region (3) having a layered conductor coil assembly (10) forming cylindrical conductor layers (11, . . . ), each having plural circular conductor turns (12) centered around and aligned along the axis of cylindrical symmetry (z). The reinforced coil region further includes a layered corset coil assembly (20) having an inner radius bigger than an outer radius of the layered conductor coil assembly (10), and a corset sheet assembly (30) including a foil element forming a corset sheet (31, . . . ). A cross section of the corset sheet with any plane perpendicular to the z-axis forms a segmented circle centered around the z-axis, the radius of which is bigger than that of one of the conductor layers and smaller than that of another of the conductor layers. In addition, the segmented circle covers at least 90% of a full circle but has
(Continued)

at most four segments. The assembly provides mechanical reinforcement against radial magnetic forces.

16 Claims, 4 Drawing Sheets

(56) References Cited

U.S. PATENT DOCUMENTS

| | | |
|---|---|---|
| 5,285,181 A | 2/1994 | Laskaris et al. |
| 5,379,020 A | 1/1995 | Meier et al. |
| 5,606,300 A | 2/1997 | Koyama et al. |
| 5,917,393 A | 6/1999 | Kupiszewski et al. |
| 7,015,779 B2 | 3/2006 | Markiewicz et al. |
| 2002/0173429 A1 | 11/2002 | Ehrenberg et al. |
| 2003/0121696 A1 | 7/2003 | Pourrahimi et al. |
| 2006/0284711 A1 | 12/2006 | Atkins et al. |

FOREIGN PATENT DOCUMENTS

| | | |
|---|---|---|
| JP | S58194309 A | 11/1983 |
| JP | H08-51016 A | 2/1996 |
| JP | 2000-30992 A | 1/2000 |
| JP | 2006-120828 A | 5/2006 |
| JP | 2009-218444 A | 9/2009 |
| JP | 2010-21475 A | 1/2010 |
| JP | 2008-4868 B | 11/2011 |
| JP | 2010045176 A | 2/2021 |
| JP | 2021-61268 A | 4/2021 |
| WO | 201718144 A1 | 2/2017 |

OTHER PUBLICATIONS

Japanese Office Action with English translation, Application No. 2021-136688, dated Sep. 20, 2022, 7 pages.

* cited by examiner

REINFORCEMENT OF A SUPERCONDUCTING MAGNET COIL

CROSS REFERENCE TO RELATED APPLICATIONS

This application claims foreign priority under 35 U.S.C. § 119(a)-(d) to European Patent Application 20 193 742.2 filed on Aug. 31, 2020, and the contents of which are incorporated into the present application by reference in their entirety.

FIELD OF THE INVENTION

The invention relates to a superconducting magnet assembly. The field of application of the invention is mechanical reinforcement of a cylindrical magnet coil assembly of a superconducting magnet assembly against magnetic forces acting on the superconductor.

BACKGROUND

An exemplary, known superconducting magnet assembly comprises a cylindrical magnet coil assembly with an axis of cylindrical symmetry and with a reinforced coil region. The reinforced coil region includes a layered conductor coil assembly comprising a conductor tape or a conductor wire, forming at least four cylindrical conductor layers, each having a plurality of circular conductor turns centered around and aligned along the axis of cylindrical symmetry. The conductor tape or conductor wire includes at least one superconducting element, forming a continuous path along the circular conductor turns of at least one cylindrical conductor layer and carries an electrical current Icond, the conductor tape or conductor wire having an elastic modulus Econd in the circumferential direction of the circular conductor turns. The reinforced coil region further includes a layered corset coil assembly comprising a corset tape or a corset wire, forming at least one cylindrical corset layer, having a plurality of circular corset turns centered around and aligned along the axis of cylindrical symmetry, the corset tape or the corset wire having an elastic modulus Ecors in the circumferential direction of the circular corset turns, with:

$$Ecors > 1.5 * Econd,$$

the layered corset coil assembly having an inner radius bigger than the outer radius of the layered conductor coil assembly. The reinforced coil region further includes a corset sheet assembly comprising a corset foil element forming at least one corset sheet, the cross section of at least one corset sheet with any plane perpendicular to the axis of cylindrical symmetry comprising a segmented circle centered around the axis of cylindrical symmetry, the radius of the segmented circle of at least one corset sheet being bigger than the radius of at least one cylindrical conductor layer and smaller than the radius of at least another cylindrical conductor layer.

Such a superconducting magnet assembly is known from U.S. Pat. No. 5,285,181 A1 (=Reference [1]).

In such a cylindrical magnet coil assembly, magnetic forces compress the coils axially and deform the coils radially, the radial deformation leading to circumferential strain and stress (hoop stress) in the conductor.

Hoop stress in a circular conductor turn of a cylindrical magnet coil assembly scales with the radius of the circular conductor turn, with the strength of the axial component of the magnetic field in the circular conductor turn, and with the electrical current density in the circular conductor turn (electrical current divided by the cross-sectional area of the conductor). The circumferential strain of a circular conductor turn scales with the hoop stress and the inverse of the elastic modulus of the conductor and must not exceed a maximum value beyond which the critical current density of a superconducting element of the conductor would be degraded.

This limit for the circumferential strain imposes a limit on the maximum allowed electrical current density in the circular conductor turns of a cylindrical magnet coil assembly. Limiting the electrical current density in a cylindrical magnet coil assembly indicates that more circular conductor turns are required to generate the same magnetic field, which makes the cylindrical magnet coil assembly larger and more expensive. Therefore, the goal of mechanical reinforcement against magnetic forces is reduction of conductor volume and cost.

Mechanical reinforcement of a cylindrical magnet coil assembly is commonly achieved by internal or external reinforcement of the conductor itself, thereby increasing the overall elastic modulus of the conductor, or by incorporation of structural mechanical reinforcement elements into the cylindrical magnet coil assembly, thereby reducing the hoop stress in the conductor.

Internal reinforcement of a conductor is achieved by incorporation of strands of reinforcing material into the precursor material of the conductor, and then processing the conductor into its final form. This method is not applicable in combination with some kinds of superconductors, and it comes with significantly increased materials and processing costs. Therefore, the field of application of the invention is restricted to mechanical reinforcement of a cylindrical magnet coil assembly of a superconducting magnet assembly other than by internal reinforcement of the conductors.

One kind of mechanical reinforcement of a cylindrical magnet coil assembly involves application of structural reinforcement material onto a conductor after its manufacturing. Such externally reinforced conductors are known from references [2], [3], and [4]. In [2], a superconducting filament is embedded in a strand of a high-strength material over the whole length of the conductor. In [3], a fiber reinforcement element is applied to a superconducting strand having the form of a hollow cylinder, both on the inside and outside of the cylinder surface. In [4], a composite wire with superconducting filaments is clad with a high-strength material. Stiffening a conductor by application of external reinforcement elements increases its capability to withstand magnetic forces in a cylindrical magnet coil assembly but it also obstructs processing the conductor into a desired form, e.g. if a small bending radius is required. Moreover, external reinforcement is not applicable to some kinds of superconductors, and it comes with significantly increased materials and processing costs. External conductor reinforcement may also deteriorate the geometrical precision of a magnet coil winding, leading to magnetic field inhomogeneity.

For many applications of a superconducting magnet assembly with a cylindrical magnet coil assembly it is therefore more appropriate to incorporate mechanical reinforcement elements not onto the conductor but into the structure of the cylindrical magnet coil assembly. Structural reinforcement elements for cylindrical magnet coil assemblies are known from References [5], [6], [7], [8], [9], [10], [11], [12], and [13].

A first category of structural magnet coil reinforcement elements provides external corsets applied on the outside of a layered conductor coil assembly. In [5], a solid tube is mounted outside of a multi-layer superconducting coil. In [6], a corseting wire is wound outside of a multi-layer superconducting coil. Such reinforcing elements outside of a layered conductor coil assembly have limited efficiency throughout the entire layered conductor coil assembly. A layered conductor coil assembly is not a rigid structure and can be compressed significantly in the radial direction, mainly due to voids between individual cylindrical conductor layers or due to compressible components inside the coil structure, mainly soft electrical insulation materials.

Solutions to this problem are impregnation of the layered conductor coil assembly with a rigid filler material and/or introduction of reinforcement structures inside the layered conductor coil assembly, preferably on each individual cylindrical conductor layer or even co-wound with each circular conductor turn. In [7], a cylindrical magnet coil assembly is constructed from several nested sub-coils, each having its own reinforcing structure containing hollow cylinders holding back individual circular conductor turns of the sub-coils. In [8], superconductor layers in the form of hollow cylinders are corseted with a reinforcing strand material, e.g. steel wire, and bonded to the corset with solder or resin. In [9], a plurality of mechanical stabilization structures for individual circular conductor turns or cylindrical conductor layers of a layered conductor coil assembly are proposed, and in addition several kinds of adhesive filler materials. In [10], coil reinforcement is achieved by fiber layers applied on each cylindrical conductor layer, the layered conductor coil assembly being impregnated with a filler material and then banded with steel tape using wet winding. In [11], a fiber reinforced plastic rectangular wire is co-wound with a superconducting wire. In [12], several rigid filler materials are proposed to strengthen a layered conductor coil assembly, the filler materials being optimized to avoid cracking under mechanical load. In [13], a thermoplastic filler material is proposed.

Even if, regarding effective reinforcement throughout the whole layered conductor coil assembly, layer-wise or turn-wise application of reinforcement and/or coil stiffening with a rigid filler material is superior to reinforcement applied only externally to an intrinsically soft-layered conductor coil assembly, these solutions have several drawbacks on their own. Apart from the additional effort in the coil manufacturing process, the proposed reinforcement elements inside the layered conductor coil assembly can deteriorate the geometrical precision of the magnet coil winding, leading to magnetic field inhomogeneity. Also, winding of a cylindrical corset layer after each cylindrical conductor layer requires cutting and splicing the conductor, increasing the risk of imperfection of the superconducting path throughout the whole layered conductor coil assembly. The risk of quenching a superconducting magnet due to cracking of a rigid filler material under the magnetic forces acting on a cylindrical magnet coil assembly may be mitigated by optimization of the filler material, as proposed in [12], but it cannot be avoided completely.

In the initially cited Reference [1], foil elements are used as a mechanical reinforcement in a layered conductor coil assembly, in combination with a layered corset coil assembly. The foil elements are strips mounted on cylindrical conductor layers, each being aligned with the axis of cylindrical symmetry of the cylindrical magnet coil assembly. The cross section of the strips mounted on a cylindrical conductor layer with any plane perpendicular to the axis of cylindrical symmetry of the cylindrical magnet coil assembly is an interrupted circular line with several segments each belonging to a single foil strip. The foil strips only act against axial forces (along the axis of cylindrical symmetry of the cylindrical magnet coil assembly), while radial forces (perpendicular to the axis of cylindrical symmetry of the cylindrical magnet coil assembly) leading to hoop stress in the superconductor are managed only by the conductor wire of the layered conductor coil assembly and by the corset wire of the layered corset coil assembly. The layered corset coil assembly is wound radially outside of the layered conductor coil assembly, i.e. the layered corset coil assembly is not acting locally on each circular conductor turn of the cylindrical conductor layers of the layered conductor coil assembly. For efficient transmission of the radial force acting on each circular conductor turn to the corset coil assembly, the layered conductor coil assembly must be impregnated with resin together with the layered corset coil assembly.

SUMMARY

One object of the invention is to provide mechanical reinforcement against radial magnetic forces acting on a cylindrical magnet coil assembly of a superconducting magnet assembly. In a first aspect, the invention provides structural reinforcement integrated into a layered conductor coil assembly, preferably on each individual cylindrical conductor layer, thereby avoiding loss of reinforcement efficiency throughout large areas of the layered conductor coil assembly due to its intrinsic softness. Furthermore, the inventive structural reinforcement solution avoids both (i) the necessity of a rigid filler material for radial strengthening of the layered conductor coil assembly to improve force transmission e.g. onto an external layered corset coil assembly, and (ii) the necessity of layer-wise corseting with or co-winding of a reinforcement strand.

These and other objects are achieved, in accordance with one formulation of the invention, by combining a layered corset coil assembly external to a layered conductor coil assembly with a corset sheet assembly integrated into said layered conductor coil assembly, the corset sheet assembly comprising a corset foil element, forming at least one corset sheet, characterized in that the cross section of at least one corset sheet with at least one plane perpendicular to the axis of cylindrical symmetry comprises a segmented circle covering at least 90% of a full circle and having not more than four segments, and characterized in that the corset foil element has an in-plane elastic modulus Efoil, with Efoil>1.5*Econd, and furthermore characterized in that the layered conductor coil assembly has at least one cylindrical conductor layer with at least one circular conductor turn with:

$$Icond > 0.005 * Econd * Acond / (Bz * r),$$

where:
Icond is the electrical current in the circular conductor turn,
Acond is the cross-sectional area of the conductor tape or conductor wire of the circular conductor turn,
Bz is the component of the magnetic field along the axis of cylindrical symmetry (z) in the circular conductor turn,
r is the radius of the circular conductor turn.

The elastic moduli Econd, Ecors, Efoil relate hoop stress to circumferential strain in a circular conductor turn or a circular corset turn or a corset sheet, in the respective element. In the inventive superconducting magnet assembly, the elastic modulus is the ratio of hoop stress to circumferential strain. Both hoop stress and the elastic modulus therefore depend on the circumferential strain in the respective element under operating conditions of the superconducting magnet assembly. This definition of elastic modulus is commonly referred to as secant elastic modulus.

The inventive superconducting magnet assembly allows reducing superconductor volume and cost of a layered conductor coil assembly by increasing the electrical current Icond in the superconductor beyond the strain limit of the same superconductor being operated in the environment of a corresponding layered conductor coil assembly without additional structural reinforcement elements, thereby straining the structural reinforcement elements lying radially outside of the superconductor, thereby maintaining a high radial pressure between the cylindrical conductor layers and the structural reinforcement elements, thereby creating friction between the cylindrical conductor layers and overlying reinforcement elements, including corset sheets, thereby enabling corset sheets to withstand circumferential stress despite the fact that they are not forming a circumferentially closed structure around the cylindrical conductor layers.

Unlike other structural reinforcement elements integrated into a layered conductor coil assembly, preferably on each individual cylindrical conductor layer, corset sheets do not significantly increase coil-manufacturing expense, and they can be applied without cutting and splicing the conductor. The bonding between corset sheets and cylindrical conductor layers by friction eliminates the need for a rigid or adhesive filler material in the layered conductor coil assembly. Corset sheets do not impair the cylindrical geometry of the layered conductor coil assembly, and therefore the homogeneity of the magnetic field is maintained.

Other than as a structural reinforcement element in a layered conductor coil assembly, foil elements are commonly used in superconducting magnet assemblies with other purposes, mainly as electrical insulation or to create a flat surface as a basis for over-winding of already wound cylindrical conductor layers. Such foils cannot act as a structural reinforcement element as part of a corset sheet assembly because their elastic modulus is too low and/or because they would yield under circumferential stress, being a circumferentially open structure not bound sufficiently to the adjacent cylindrical conductor layers by friction.

The invention applies to superconducting magnet assemblies comprising a cylindrical magnet coil assembly with a layered conductor coil assembly operated at least partially under the condition of a particularly large component of the magnetic field along the axis of cylindrical symmetry in a circular conductor turn of the conductor coil assembly, and/or a particularly large radius of a circular conductor turn of the conductor coil assembly, and/or a particularly high critical current density of the superconductor at the respective operating point of field strength and temperature in a circular conductor turn of the conductor coil assembly, and/or a particularly low elastic modulus of the conductor of a circular conductor turn of the conductor coil assembly,
while having to fulfil particularly strong requirements regarding low material cost and manufacturing expense, and/or high magnetic field quality regarding spatial homogeneity and temporal stability, and/or low quenching risk.

Preferred/Illustrative Embodiments

In an illustrative embodiment of the superconducting magnet assembly, the cross section of at least one corset sheet with at least one plane perpendicular to the axis of cylindrical symmetry is a segmented circle having not more than two segments, preferably only one segment. Segmentation reduces the circumferential reinforcing efficiency of a corset sheet and therefore should be avoided if possible.

In another advantageous embodiment of an inventive superconducting magnet assembly, at least two corset sheets have a cross section with at least one plane perpendicular to the axis of cylindrical symmetry, each cross section comprising a segmented circle, with at least one segment of one segmented circle overlapping circumferentially with at least one gap of another segmented circle. Due to circumferential segmentation, corset sheets have circumferential gaps between segment borders. These gaps are zones without circumferential reinforcement of an underlying cylindrical conductor layer by a corset sheet. Circumferential reinforcement can be restored by a segment of another corset sheet covering a gap of a first corset sheet.

In a further illustrative embodiment of an inventive superconducting magnet assembly, the corset sheets have a thickness<0.5 mm, preferably <0.2 mm. Corset sheets can be incorporated into a reinforced coil region in direct mechanical contact with underlaying individual circular conductor turns. Due to the efficient transfer of radial magnetic forces from the circular conductor turns to the corset sheets, the amount of corset material can be minimized, resulting in a more compact cylindrical magnet coil assembly.

In a preferred embodiment, a fraction of at least 0.5% of the volume of the reinforced coil region is empty or at least not filled with a solid material, enabling the use of a round conductor wire in a layered conductor coil assembly, having an inherently low geometrical filling factor. Voids within a conductor coil assembly interrupt the transfer path of radial magnetic forces from a circular conductor turn to a reinforcing structural element unless it is in direct mechanical contact with the circular conductor turn, which is achieved by a corset sheet incorporated in a reinforced coil region. Moreover, the layer-wise mechanical reinforcement against radial magnetic forces with corset sheets is efficient without a rigid filler material which would reduce the void fraction within the reinforced coil region but could lead to quenching of the superconductor due to cracking under magnetic forces.

In an advantageous embodiment, the reinforced coil region comprises a solid filler material containing an acyclic saturated hydrocarbon compound or a resin compound. A solid filler material improves transmission of radial magnetic forces from a circular conductor turn to a reinforcing structural element, especially if a reinforced coil region has a high void fraction. Moreover, a filler material may act as a glue between a circular conductor turn and a corset sheet, improving the circumferential force transfer to the corset sheet. Resins fulfill this task but have a tendency to crack under magnetic forces, which can be avoided by the use of acyclic saturated hydrocarbon compounds (e.g. paraffin) which on the other hand have reduced filling efficiency due to thermal shrinkage.

An advantageous embodiment provides that the cylindrical magnet coil assembly comprises at least two reinforced coil regions, the layered corset coil assembly of a first reinforced coil region having an outer radius equal or smaller than the inner radius of the layered conductor coil assembly of another reinforced coil region, said first reinforced coil region having an extension along the axis of cylindrical symmetry overlapping at least partially with the extension along the axis of cylindrical symmetry of said other reinforced coil region. Subdivision of a cylindrical magnet coil assembly into several radially nested reinforced coil regions allows the integration of layered corset coil assemblies within the radial build-up of a multi-layered cylindrical magnet coil assembly. Despite the presence of corset sheets acting as local reinforcement directly on individual cylindrical conductor layers the presence of an efficient layered corset coil assembly radially outside of the layered conductor coil assembly is required for reinforcement of a cylindrical magnet coil assembly because the corset sheets must be pressed against the underlaying cylindrical conductor layers in order to maintain friction. The compressing radial force is transferred from the layered corset coil assembly through the layered conductor coil assembly onto the corset sheet. The force transmission path through the layered conductor coil assembly may be interrupted e.g. by voids. Therefore, the number of cylindrical conductor layers per layered conductor coil assembly is limited which requires subdivision of multi-layer cylindrical magnet coil assemblies into several reinforced coil regions, each with its own layered corset coil assembly.

A further development provides that each layered conductor coil assembly of a reinforced coil region has less than 14 cylindrical conductor layers. This embodiment limits the number of cylindrical conductor layers per layered conductor coil assembly to ensure a sufficiently uninterrupted radial force transmission path throughout the reinforced coil region. This helps to transmit a compressing radial force from a layered corset coil assembly through the layered conductor coil assembly onto a corset sheet, which is a requirement for maintaining friction between the corset sheet and an underlaying cylindrical conductor layer, thus enabling the corset sheet to reinforce the cylindrical conductor layer against circumferential strain.

In specific embodiments, the superconducting element of a conductor tape or a conductor wire of a layered conductor coil assembly comprises either niobium and tin, or bismuth and strontium and calcium and copper oxide, or a rare earth element and barium and copper oxide. These materials are superconductors with a particularly high critical current density, which can only be exploited in a layered conductor coil assembly if the electrical current is not driving the conductor tape or conductor wire containing this superconductor beyond the force limit of the conductor. In these embodiments, the electrical current density in a reinforced coil region can be enhanced significantly compared to a cylindrical magnet coil assembly without mechanical reinforcement, whereby the amount of conductor wire or tape is reduced accordingly.

In two other particular embodiments, a corset foil element of a corset sheet assembly or a corset tape or corset wire of a layered corset coil assembly comprises a steel alloy or a nickel alloy or a fiberglass compound. These materials offer the required mechanical properties and can be shaped into the right form to be used in a corset sheet assembly or in a layered corset coil assembly of a reinforced coil region of a cylindrical magnet coil assembly. Nickel alloys, typically comprising chromium and other additives, are resistant against corrosion and are particularly suited for application in a cylindrical magnet coil assembly being processed at elevated levels of temperature or pressure. Fiber glass compounds can act as an electrical insulation of cylindrical conductor layers of a layered conductor coil assembly.

Also within the scope of the present invention is an NMR apparatus comprising the superconducting magnet assembly as described above. Incorporation of a corset sheet assembly into a reinforced coil region of a cylindrical magnet coil assembly provides mechanical support for each individual cylindrical conductor layer of a layered conductor coil assembly without the need for additional cutting and splicing of the conductor tape or wire (as would be the case e.g. with a layer-wise incorporation of a layered corset coil assembly), and without impairing the cylindrical geometry of the layered conductor coil assembly (as would be the case e.g. with co-winding of a corset wire or tape with the conductor wire or tape), and without increasing the quenching risk of the cylindrical magnet coil assembly (as would be the case e.g. with a rigid filler material for transmission of magnetic forces from cylindrical conductor layers to a reinforcement structure external to the layered conductor coil assembly). Low risk of magnetic field drift due to electrical resistance from conductor splices, and a good magnetic field homogeneity due to accurate cylindricity of the conductor layers, and low risk of magnet quenches make the inventive superconductive magnet assembly particularly well suited for application in an apparatus for NMR spectroscopy.

Also within the scope of the present invention is a method for mechanical reinforcement of a cylindrical magnet coil assembly, characterized in that thermal bonding between a circular conductor turn and a corset sheet of a reinforced coil region is induced by heat treatment of the reinforced coil region at a temperature >500° C. for at least 24 hours. Compared to bonding purely by friction, additional thermal bonding enhances the capability of a corset sheet to exert a force on an underlaying circular conductor turn in the circumferential direction, which is a precondition for the corset sheet to act as an efficient mechanical reinforcement against mechanical strain of the circular conductor turn due to radial magnetic forces.

BRIEF DESCRIPTION OF THE DRAWINGS

Various exemplary embodiments of the invention are shown in the drawing.

DETAILED DESCRIPTION

Figure 1:
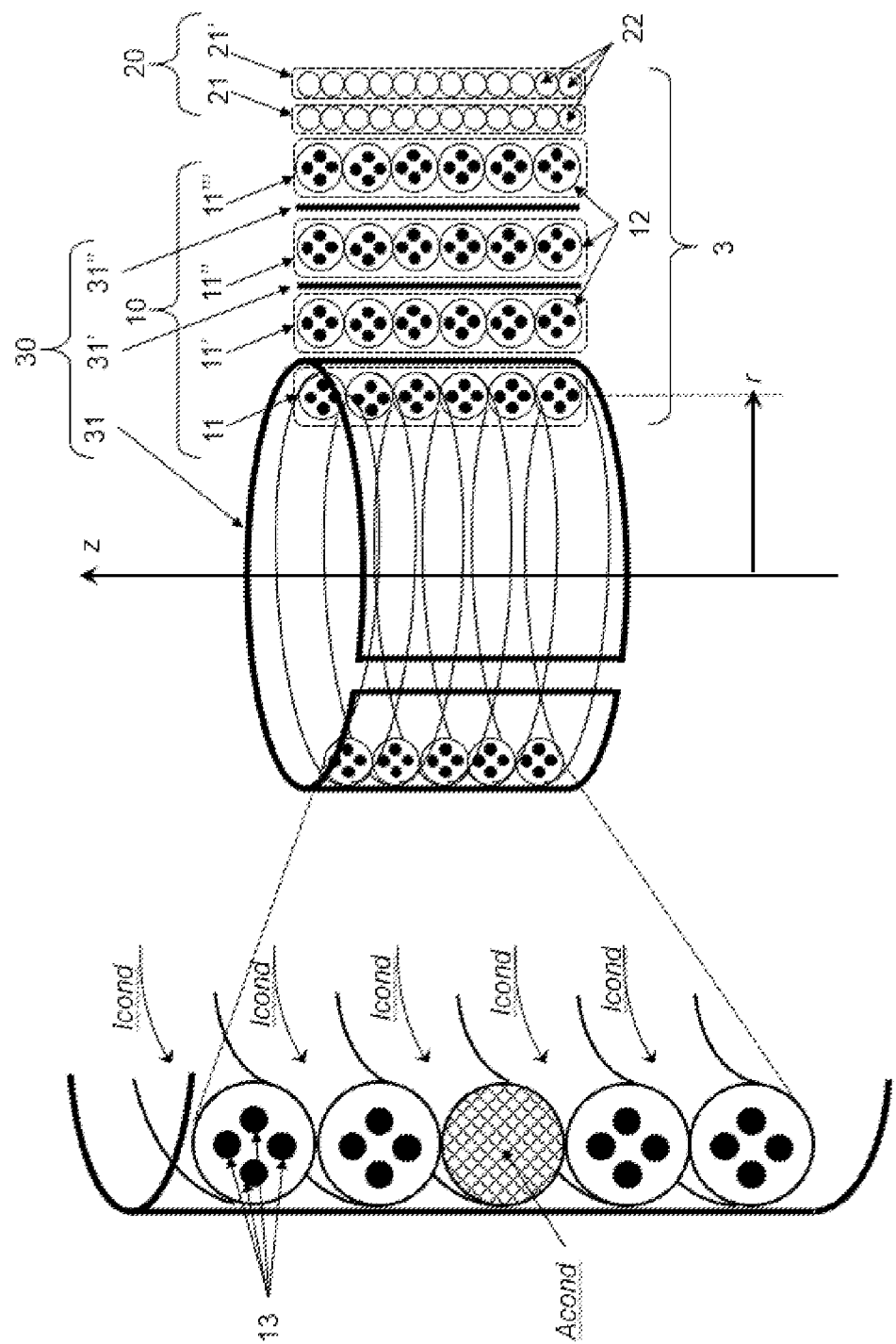
FIG. 1 shows a reinforced coil region of a cylindrical magnet coil assembly of a superconducting magnet assembly according to the invention in a cross-sectional view in a half-plane containing the axis of cylindrical symmetry of the cylindrical magnet coil assembly, with a cylindrical conductor layer and a corset sheet shown in a spatial representation and as enlarged cross-sectional cutout.

FIG. 1 shows a reinforced coil region 3 in a cross-sectional view in a half-plane containing the axis of cylindrical symmetry z, and a spatial representation of a cylindrical conductor layer 11 and of a corset sheet 31, and an enlarged cross-sectional cutout thereof. The reinforced coil region 3 comprises a layered conductor coil assembly 10 with four cylindrical conductor layers 11, 11', 11", 11''', and a layered corset coil assembly 20 with two cylindrical corset layers 21, 21', and a corset sheet assembly 30 with three corset sheets 31, 31', 31".

Each cylindrical conductor layer 11, 11', 11", 11''' comprises a plurality of circular conductor turns 12, centered around and aligned along the axis of cylindrical symmetry z, each conductor turn 12 being wound with a round conductor wire and having a radius r from the axis of cylindrical symmetry z. The conductor wire can have a rectangular cross-sectional shape instead, or a conductor tape can be used in place of a wire (not shown in FIG. 1). The conductor wire has a cross-sectional area Acond and comprises a superconducting element 13, forming a continuous path along the circular conductor turns 12 of at least one cylindrical conductor layer 11, 11', 11", 11''' and carrying an electrical current Icond. The superconducting element 13 can comprise several strands of superconducting material embedded in a metal matrix (typical for Nb based low temperature superconductors or Bi based high temperature superconductors), or a single layer deposited on a metal substrate (typical for rare earth based high temperature superconductors; not shown in FIG. 1).

Each cylindrical corset layer 21, 21' comprises a plurality of circular corset turns 22, centered around and aligned along the axis of cylindrical symmetry z, each corset turn 22 being wound with a round corset wire. The corset wire can have a rectangular cross-sectional shape instead, or a corset tape can be used in place of a wire (not shown in FIG. 1).

Each corset sheet 31, 31', 31" comprises a corset foil element thinner than 0.5 mm, preferably thinner than 0.2 mm. Each corset sheet 31, 31', 31" is assembled between two radially adjacent cylindrical conductor layers 11, 11', 11", 11''', thus taking the shape of a segmented cylindrical surface, interrupted circumferentially by at least one gap, as shown for corset sheet 31 with exactly one segment and one gap.

Typically, during operation a reinforced coil region 3 is exposed to a magnetic field with a strong axial component Bz. If the electrical current Icond carried by the superconducting element 13 of a circular conductor turn 12 itself creates a magnetic field with an axial component parallel to the background field then the magnetic force acting on the circular conductor turn 12 has a strong component pointing radially outwards, i.e. away from the axis of cylindrical symmetry z. This radial magnetic force creates a radial magnetic pressure inside the layered conductor coil assembly 10, pushing on the layered corset coil assembly 20 and on the corset sheet assembly 30 of the reinforced coil region 3, thereby straining the reinforced coil region 3 circumferentially. In a reinforced coil region 3 with negligible corseting effect from a weak corset sheet assembly 30 the radial magnetic pressure is accumulated throughout the whole reinforced coil region 3 and is highest at the interface between the layered conductor coil assembly 10 and the layered corset coil assembly 20. If the corset sheet assembly 30 is stronger, then the corset sheets 31, 31', 31" can intercept the transmission of radial magnetic pressure between cylindrical conductor layers 11, 11', 11", 11''' efficiently, leading to a more uniform distribution of radial magnetic pressure throughout the reinforced coil region 3.

As long as no radial gaps are present in a reinforced coil region 3 and neglecting the radial compressibility of the reinforced coil region 3, the radial expansion due to the radial magnetic pressure and thereby also the circumferential strain can be assumed to be the same in all mechanical components of the reinforced coil region 3. With a certain amount of corseting material contained in a layered corset coil assembly 20 and in a corset sheet assembly 30 the strain of the reinforced coil region 3 can be reduced most efficiently if the elastic modulus Ecors, Efoil is large in both the corset wire and the corset foil element. In case of anisotropic material, only the elastic modulus relating strain and stress in circumferential direction has to be taken into account. Typically, Ecors and Efoil should be at least 50% larger than the elastic modulus Econd of the conductor tape or conductor wire. The elastic modulus of a material may depend on the strain of the material. Therefore, the relation between Ecors or Efoil and Econd is valid only under the assumption of similar strain in all corset and conductor materials of a reinforced coil region 3.

In an exemplary embodiment of the reinforced coil region 3 of FIG. 1 a circular conductor turn 12 has a radius of 50 mm and it carries an electrical current Icond of 470 A in a background magnetic field with an axial component Bz of 15 T. The round conductor wire has a diameter of 1 mm, a cross-sectional area Acond of 0.785 $mm^2$, and an elastic modulus Econd of 50 GPa. Without external reinforcement, this wire would be strained by 0.9%, which would damage its superconducting element 13. In the exemplary embodiment of the reinforced coil region 3 the circumferential strain is reduced by a factor of 3 to 0.3% by a layered corset coil assembly 20 and a corset sheet assembly 30, each having an elastic modulus Ecors and Efoil respectively of 200 GPa. In order to achieve the desired reduction of circumferential strain, the cross-sectional area of the combined layered corset coil assembly 20 and corset sheet assembly 30 in a plane containing the axis of cylindrical symmetry z must be half of the cross-sectional area of the layered conductor coil assembly 10. In general, the ratio of corseting and conducting cross-sectional area is the strain reduction factor minus 1, times the quotient of Econd and Ecors.

If an isolated corset sheet 31 were exposed to radial pressure against its inner cylindrical surface it would not be strained circumferentially but the gap interrupting the corset sheet 31 on its circumference would widen. Inside of a reinforced coil region 3, widening of the gap can be avoided by bonding the edge regions alongside a gap of the corset sheet 31 to the adjacent cylindrical conductor layers 11, 11' by friction. The circumferential extension of one bonded edge region of the corset sheet 31 is the product of circumferential strain and of the elastic modulus Efoil and radial thickness of the corset foil element, divided by the radial magnetic pressure from the underlaying cylindrical conductor layer 11, and divided by the coefficient of friction between the corset foil element and the conductor tape or conductor wire, and divided by two. The factor of two is due to frictional bonding on the inner as well as on the outer surface of the corset sheet 31.

The radial magnetic pressure of an individual circular conductor turn 12 against a hypothetical completely rigid corseting element would be the product of the axial component of the magnetic field Bz, the current density Icond/Acond, and the width of the conductor wire in the radial direction of the circular conductor turn 12. For the radial magnetic pressure on a realistic corseting element, this product has to be multiplied with the actual strain reduction factor achieved by corseting, compared to an uncorseted circular conductor turn 12 under the same operating conditions. For the exemplary embodiment of the reinforced coil region 3 of FIG. 1 with Bz of 15 T, Icond of 470 A, Acond of 0.785 mm², with a radial conductor width of 1 mm, and with a strain reduction factor of (0.9%-0.3%)/0.9%=2/3, the radial magnetic pressure on a corset sheet 31 is 6 MPa. The effective radial pressure on a corset sheet 31 in a reinforced coil region 3 may deviate from this value because the calculation neglects mechanical deformation of conductor or corset elements due to the winding process or due to cooling of the reinforced coil region 3 below the critical temperature of the superconducting element 13. Moreover, it neglects that, in general, radial magnetic pressure can accumulate throughout the reinforced coil region 3 over several cylindrical conductor layers 11, 11', 11", 11'''.

With this approximation of a radial magnetic pressure of 6 MPa on a corset sheet 31, the circumferential extension of one bonded edge region of the corset sheet 31 can now be calculated to have a value of 25 mm for the exemplary embodiment, further assuming an elastic modulus of the corset foil element Efoil of 200 GPa, a radial thickness of the corset foil element of 0.1 mm, and a coefficient of friction between the corset foil element and the conductor wire of 0.2. Each gap in a corset sheet 31 creates two bonded edge regions, i.e. the total circumferential extension of the bonded edge regions of corset sheet with one gap is 50 mm in the exemplary embodiment. This accounts for 16% of the area covered by the corset sheet 31, assuming a radius of 50 mm for the underlaying cylindrical conductor layer 11.

In the bonded edge regions a corset sheet 31 cannot act as a circumferential reinforcement for cylindrical conductor turns 12 of an underlaying cylindrical conductor layer 11, it even tends to strain them further. Therefore, the circumferential extension of the bonded edge regions alongside a gap of the corset sheet 31 must be minimized, as well as the gap itself, which should account for less than 10% of the area covered by the corset sheet 31. Reduction of the circumferential extension of the bonded edge regions can be achieved by increasing the friction coefficient between the corset sheet 31 and adjacent cylindrical conductor layers 11, 11'. The choice of corset sheet material and of conductor tape or conductor wire material is determined by other criteria than by a large friction coefficient, mainly by good mechanical or superconducting properties respectively. Nevertheless, the coefficient of friction can be increased e.g. by introduction of a solid filler material in the reinforced coil region 3, typically containing an acyclic saturated hydrocarbon compound (e.g. paraffin) or a resin compound. A method to greatly enhance friction is induction of thermal bonding by a heat treatment step of the reinforced coil region 3, typically at a temperature >500° C. for at least 24 hours.

The exemplary embodiment of the reinforced coil region 3 of FIG. 1 shows that circumferential segmentation of the corset sheet 31 has to be avoided because each additional gap introduces two additional bonded edge regions where the corset sheet 31 is not effective as a mechanical reinforcement for the underlaying cylindrical conductor layer 11.

Figure 2:
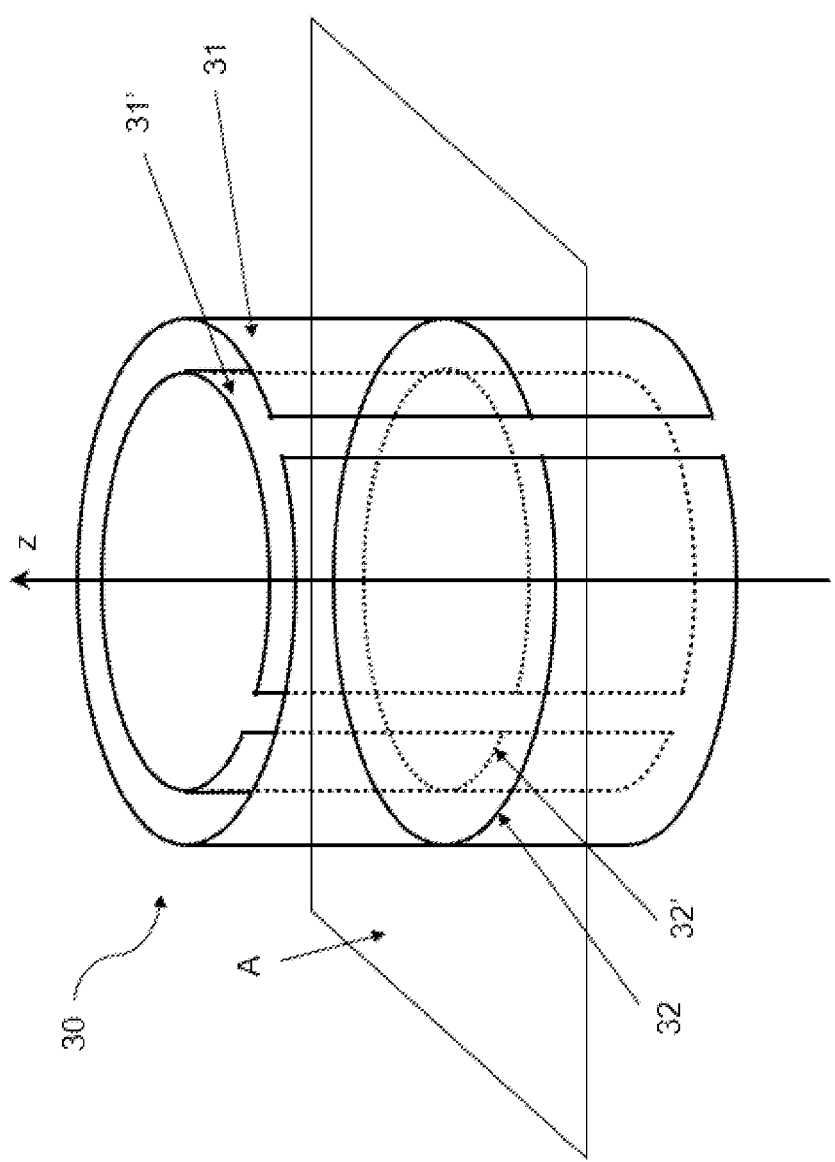
FIG. 2 shows a spatial representation of a corset sheet assembly, and its cross-section with a plane perpendicular to the axis of cylindrical symmetry.

Due to the loss of corseting efficiency in the bonded edge regions of a corset sheet 31, it is advisable to mount two corset sheets 31, 31' with at least one segment of the first corset sheet 31 covering a gap of the other corset sheet 31'. Such two corset sheets 31, 31' can be mounted radially adjacent to each other, or with a cylindrical conductor layer 11 in between. FIG. 2 shows such a corset sheet assembly 30. Moreover, FIG. 2 shows the geometrical meaning of a corset sheet 31, 31' taking the shape of a segmented cylindrical surface, interrupted circumferentially by at least one gap: i.e. a corset sheet 31, 31' has a cross section with at least one plane A perpendicular to the axis of cylindrical symmetry z comprising a segmented circle 32, 32', covering more than 90% of a full circle and having exactly one segment as in the embodiments of FIG. 1 and FIG. 2, or at least not more than four segments (not shown in FIG. 2).

Figure 3:
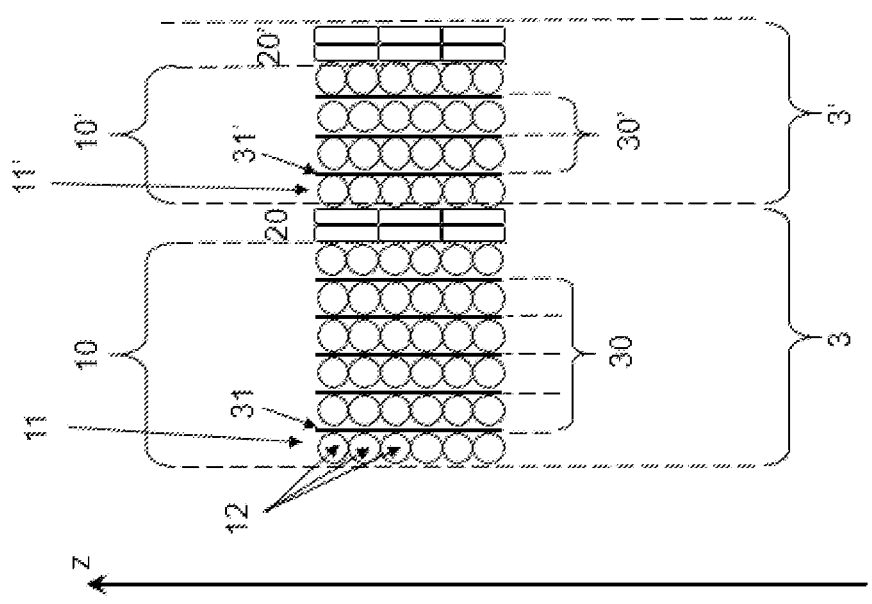
FIG. 3 shows two adjacent reinforced coil regions of a cylindrical magnet coil assembly of a superconducting magnet assembly according to the invention in a cross-sectional view in a half-plane containing the axis of cylindrical symmetry of the cylindrical magnet coil assembly.

FIG. 3 shows two reinforced coil regions 3, 3' in a cross-sectional view in a half-plane containing the axis of cylindrical symmetry z. Each reinforced coil region 3, 3' has its own layered conductor coil assembly 10, 10', its own layered corset coil assembly 20, 20', and its own corset sheet assembly 30, 30'. The layered corset coil assemblies 20, 20' comprise a corset tape with a flat rectangular cross-sectional shape. The layered conductor coil assemblies 10, 10' comprise a conductor wire with a round cross-sectional shape. The voids between the circular conductor turns 12 account for up to 21% of the volume of the layered conductor coil assemblies 10, 10'. A high void fraction makes the reinforced coil regions 3, 3' inherently soft, leading to a reduction of radial pressure in the innermost cylindrical conductor layers 11, 11', thereby increasing the circumferential extension of the bonded edge regions of the adjacent corset sheets 31, 31'. Subdivision of a large reinforced coil region 3, 3' into smaller ones with preferably less than 14 cylindrical conductor layers 11, 11', 11", 11''' is therefore advisable. Reduction of the void fraction by a solid filler material also helps to avoid loss of radial pressure within the reinforced coil region 3, 3'.

In addition to the foil elements forming a corset sheet 31, 31', 31", additional foil elements, known per se from prior art, can be included into the reinforced coil region 3, 3', e.g. between the layered conductor coil assembly 10, 10' and the adjacent layered corset coil assembly 20, 20', or between cylindrical corset layers 21, 21' of a layered corset coil assembly 20, 20', or underneath the first cylindrical conductor layer 11, 11' of a layered conductor coil assembly 10, 10'. Such foil elements can facilitate over-winding of a cylindrical conductor layer 11, 11', 11", 11''' or of a cylindrical corset layer 21, 21', or they can serve as an electrical insulation.

Figure 4:
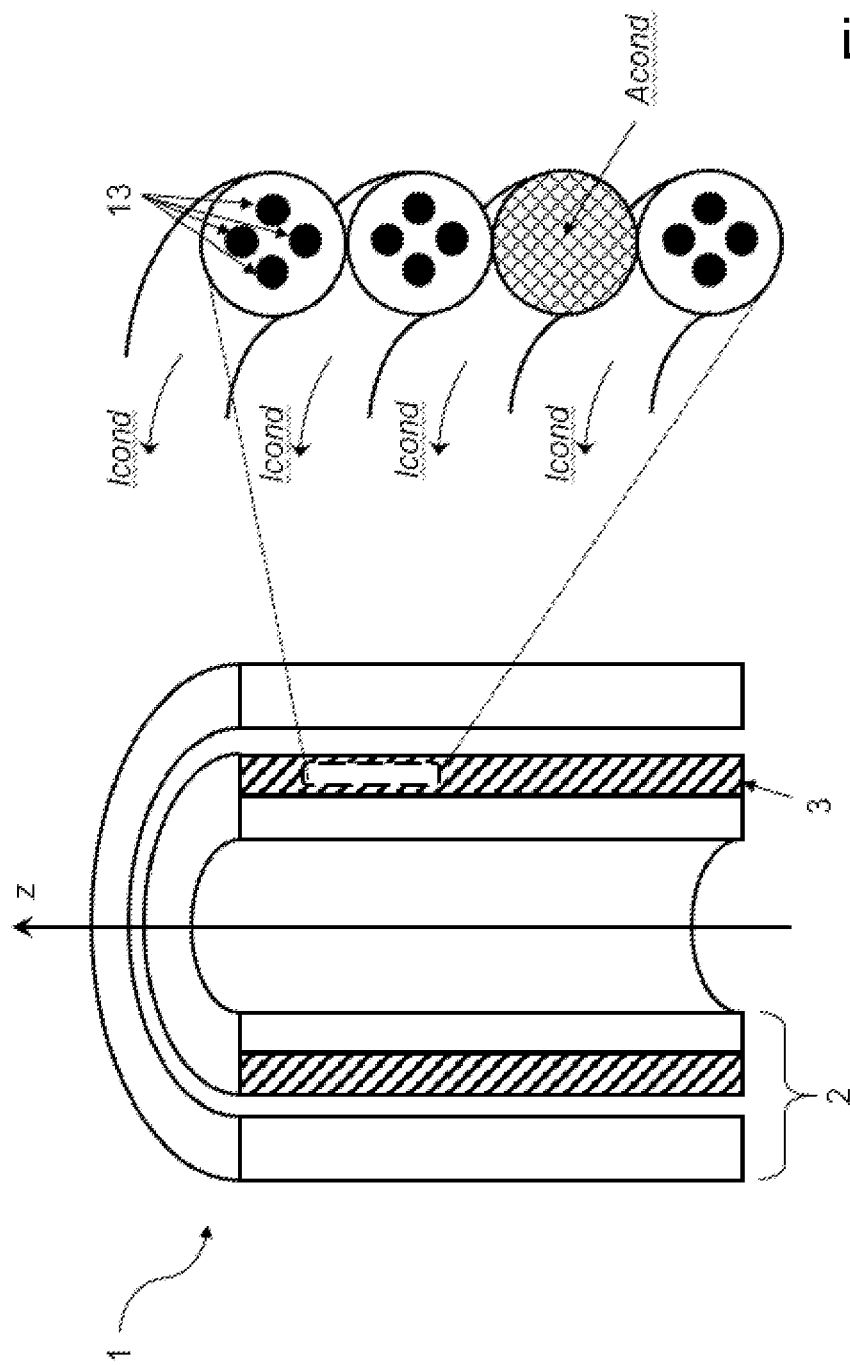
FIG. 4 shows a superconducting magnet assembly with a cylindrical magnet coil assembly in a semi-spatial representation, and an enlarged cross-sectional cutout of a cylindrical conductor layer of a reinforced coil region, according to prior art.

FIG. 4 shows a superconducting magnet assembly 1 with a cylindrical magnet coil assembly 2 with an axis of cylindrical symmetry z, in a semi-spatial representation. The superconducting magnet assembly 1 also comprises an electrical current Icond, flowing in the superconducting element 13 of a conductor wire with a cross-sectional area Acond. The cylindrical magnet coil assembly 2 comprises a reinforced coil region 3, as known from prior art. Reinforcing elements can be a layered corset coil assembly 20 on the outer radius of the reinforced coil region 3 (not shown in FIG. 4), and/or a rigid filler material (not shown in FIG. 4), and/or reinforcing strands co-wound with the conductor wire (not shown in FIG. 4), and/or axial stripes (not shown in FIG. 4) comprising a corset foil element for axial reinforcement of the reinforced coil region 3.

LIST OF REFERENCE SIGNS

1 Superconducting magnet assembly
2 Cylindrical magnet coil assembly
3, 3' Reinforced coil region
10, 10' Layered conductor coil assembly
11, 11', 11", 11''' Cylindrical conductor layer
12 Circular conductor turns
13 Superconducting element
20, 20' Layered corset coil assembly
21, 21' Cylindrical corset layer 22 Circular corset turns
30, 30' Corset sheet assembly
31, 31', 31" Corset sheet
32, 32' Segmented circle
z Axis of cylindrical symmetry
A Plane perpendicular to the axis of cylindrical symmetry (z)
Econd Secant elastic modulus of conductor tape or conductor wire
Ecors Secant elastic modulus of corset tape or corset wire
Efoil Secant elastic modulus of corset foil element
Icond Electrical current carried by a superconducting element 13
Acond Cross-sectional area of a conductor tape or conductor wire
Bz Axial component of the magnetic field
r Radius of a circular conductor turn 12

CITED REFERENCES

Publications considered for assessing the patentability:
[1] U.S. Pat. No. 5,285,181 A1
[2] EP 0291075 A2
[3] EP 0822560 A2
[4] US 2003/0121696 A1
[5] U.S. Pat. No. 5,917,393 A
[6] U.S. Pat. No. 7,015,779 B2
[7] U.S. Pat. No. 4,270,112 A1
[8] U.S. Pat. No. 5,379,020 A1
[9] US 2002/173429 A1
[10] IEEE Transactions on Magnetics, L. Van Bockstal et al., Long Life Pulsed High Field Magnets with CuAg Conductor and Internal Reinforcement, Vol. 32, No. 4, July 1996, pp. 2514-2517
[11] JP 58194309 A
[12] U.S. Pat. No. 5,606,300 A
[13] US 2006/0284711 A

What is claimed is:

1. A superconducting magnet assembly comprising a cylindrical magnet coil assembly with an axis of cylindrical symmetry (z) and with a reinforced coil region,
wherein the reinforced coil region comprises:
a layered conductor coil assembly comprising a conductor tape or a conductor wire, forming at least four cylindrical conductor layers, each having a plurality of circular conductor turns centered around and aligned along the axis of cylindrical symmetry (z), the conductor tape or conductor wire comprising at least one superconducting element, forming a continuous path along the circular conductor turns of at least one of the cylindrical conductor layers and configured to carry an electrical current Icond, the conductor tape or conductor wire having an elastic modulus Econd in a circumferential direction of the circular conductor turns,
a layered corset coil assembly comprising a corset tape or a corset wire, forming at least one cylindrical corset layer, having a plurality of circular corset turns centered around and aligned along the axis of cylindrical symmetry (z), the corset tape or the corset wire having an elastic modulus Ecors in the circumferential direction of the circular corset turns, with:

$Ecors > 1.5*Econd,$ the layered corset coil assembly having an inner radius bigger than an outer radius of the layered conductor coil assembly,
a corset sheet assembly comprising a corset foil element forming at least one corset sheet, a cross section of the at least one corset sheet with any plane (A) perpendicular to the axis of cylindrical symmetry (z) forming a segmented circle having a radius and centered around the axis of cylindrical symmetry (z), the radius of the segmented circle of the at least one corset sheet being bigger than a radius of a first of the cylindrical conductor layers and smaller than a radius of a second of the cylindrical conductor layers,
wherein the segmented circle formed by the cross section of the at least one corset sheet with the plane (A) perpendicular to the axis of cylindrical symmetry (z) covers at least 90% of a full circle and has no more than four segments;
wherein the corset foil element has an in-plane elastic modulus Efoil, with $Efoil > 1.5*Econd;$ and wherein the layered conductor coil assembly has at least one of the cylindrical conductor layers with at least one of the circular conductor turns with:

$Icond > 0.005*Econd*Acond/(Bz*r),$ where
Icond is the electrical current in the circular conductor turn,
Acond is the cross-sectional area of the conductor tape or conductor wire of the circular conductor turn,
Bz is the component of the magnetic field along the axis of cylindrical symmetry (z) in the circular conductor turn, and
r is the radius of the circular conductor turn.

2. A superconducting magnet assembly according to claim 1, wherein the segmented circle has no more than two segments.

3. A superconducting magnet assembly according to claim 2, wherein the segmented circle has exactly one segment.

4. A superconducting magnet assembly according to claim 1, wherein at least two of the corset sheets have respective cross sections with the plane perpendicular to the axis of cylindrical symmetry (z), wherein each of the cross sections forms a respective segmented circle, and wherein at least one segment of at least one of the segmented circles overlaps circumferentially with at least one gap of another of the segmented circles.

5. A superconducting magnet assembly according to claim 4, wherein the at least one corset sheet has a thickness <0.2 mm.

6. A superconducting magnet assembly according to claim 1, wherein the at least one corset sheet has a thickness <0.5 mm.

7. A superconducting magnet assembly according to claim 5, wherein the fraction of the volume of the reinforced coil region is empty of material.

8. A superconducting magnet assembly according to claim 1, wherein a fraction of at least 0.5% of a volume of the reinforced coil region is not filled with a solid material.

9. A superconducting magnet assembly according to claim 1, wherein the reinforced coil region comprises a solid filler material containing an acyclic saturated hydrocarbon compound or a resin compound.

10. A superconducting magnet assembly according to claim 1, wherein the cylindrical magnet coil assembly further comprises at least a second reinforced coil region, wherein the layered corset coil assembly of the first reinforced coil region has an outer radius equal to or smaller than an inner radius of a layered conductor coil assembly of the second reinforced coil region, wherein the first reinforced coil region has an extension along the axis of cylindrical symmetry (z) overlapping at least partially with an extension along the axis of cylindrical symmetry (z) of the second reinforced coil region.

11. A superconducting magnet assembly according to claim 1, wherein the cylindrical magnet coil assembly further comprises at least a second reinforced coil region, wherein each of the layered conductor coil assemblies of each of the reinforced coil regions has fewer than 14 of the cylindrical conductor layers.

12. A superconducting magnet assembly according to claim 1, wherein the superconducting element of the conductor tape or the conductor wire of the layered conductor coil assembly comprises either niobium and tin, or bismuth and strontium and calcium and copper oxide, or a rare earth element and barium and copper oxide.

13. A superconducting magnet assembly according to claim 1, wherein the corset foil element of the corset sheet assembly comprises a steel alloy or a nickel alloy or a fiber glass compound.

14. A superconducting magnet assembly according to claim 1, wherein the corset tape or the corset wire of the layered corset coil assembly comprises a steel alloy or a nickel alloy or a fiber glass compound.

15. A nuclear magnetic resonance (NMR) apparatus comprising the superconducting magnet assembly according to claim 1.

16. A method for mechanical reinforcement of a cylindrical magnet coil assembly of a superconducting magnet assembly according to claim 1, comprising:
  inducing bonding between the circular conductor turns and the at least one corset sheet of the reinforced coil region by heat treating the reinforced coil region at a temperature >500° C. for at least 24 hours.

* * * * *